United States Patent [19]

Dorer et al.

[11] 4,190,321
[45] Feb. 26, 1980

[54] MICROSTRUCTURED TRANSMISSION AND REFLECTANCE MODIFYING COATING

[75] Inventors: Gary L. Dorer, Taunton, Mass.; Valdis Mikelsons, Mendota Heights, Minn.

[73] Assignee: Minnesota Mining and Manufacturing Company, Saint Paul, Minn.

[21] Appl. No.: 770,043

[22] Filed: Feb. 18, 1977

[51] Int. Cl.² .............................................. G02B 1/10
[52] U.S. Cl. ..................................... 350/165; 350/1.7; 350/167; 350/211; 126/417; 428/148; 428/632; 428/913; 428/333
[58] Field of Search .................. 428/913, 914, 951, 39, 428/336, 338, 328, 329, 148, 333; 96/1.5, 68, 67, 87 R; 427/343, 377, 383 A, 383 B, 165, 126, 166, 399, 248 C, 248 B; 350/165, 164, 195, 201, 211, 1.4, 276 R, 1.7

[56] References Cited

U.S. PATENT DOCUMENTS

| | | | |
|---|---|---|---|
| 2,628,921 | 2/1953 | Weinrich | 427/383 A |
| 3,842,306 | 10/1974 | Henderson et al. | 428/329 |
| 4,005,698 | 2/1977 | Cuomo et al. | 126/270 |
| 4,013,465 | 3/1977 | Clapham et al. | 350/276 R |

FOREIGN PATENT DOCUMENTS

51-21534  2/1976  Japan .

*Primary Examiner*—Stanley S. Silverman
*Attorney, Agent, or Firm*—Cruzan Alexander; Donald M. Sell; William B. Barte

[57] ABSTRACT

Single layer coatings that render a surface more light transmitting and less light reflecting without an attendant increase in diffuse scattering are produced by depositing a thin metal film on the surface, totally converting the thin metallic film to either an oxide and/or hydroxide microstructured layer by chemical or a combination of chemical and electrochemical methods. Uniform optical properties are exhibited over large angles of incidence and an extremely broad range of wavelengths.

14 Claims, 9 Drawing Figures

MICROSTRUCTURED TRANSMISSION AND REFLECTANCE MODIFYING COATING

CROSS REFERENCE TO A RELATED APPLICATION

This application relates to a copending application filed the same day herewith, Ser. No. 770,044, now U.S. Pat. No. 4,114,983 which application is the subject of an invention by K. N. Maffitt, H. U. Brueckner and D. R. Lowrey, and is assigned to the same assignee as the present application.

BACKGROUND OF THE INVENTION (1) Field of the Invention

This invention relates to articles having coatings thereon to reduce reflection and, if desired, to increase transparency. The invention particularly relates to such single layer coatings as are believed to provide a variable gradient index of refraction at the surface of the articles.

(2) Description of the Prior Art

Various types of coatings to reduce reflectivity and improve the transparency of articles such as lenses and windows, and to improve the efficiency of solar cells and solar absorption panels are well known. Perhaps the best known are the single, or preferably multiple, layer interference coatings used on optical lenses, filters and as antireflecting films used on windows. While such coatings are desirable in that they are durable and are known to provide an extremely low reflectivity at specific wavelengths, they exhibit a number of limitations. For example, the optical characteristics of such single layer films are highly sensitive to the wavelength, such that multiple layer coatings must be employed. However, if such multiple layer coatings are used, a significant sensitivity to the direction of incident light results. It has not heretofore been possible to achieve wavelength independent, wide angle response simultaneously. Furthermore, such films are relatively expensive to produce, requiring careful control of the thickness of the coating as well as multiple coating operations.

In addition to such articles in which the reflectance therefrom is reduced via a coating having optical interference characteristics, it is also known to provide articles in which the reflectance is reduced by providing a microstructured surface over which the effective index of refraction varies continuously from the substrate to the ambient environment. See, for example, U.S. Pat. No. 2,432,484 (Moulton). It is believed that the highly sensitive vision of nocturnal insects such as moths is at least partly due to the low reflectivity from the surface of the eyes due to the presence of such a microstructure on the surface of the eye. (G. G. Bernhard et al, Acta Physiologica Scand., Vol. 63 243, pp. 1–74 (1965). More recently, a technique has been disclosed for reducing surface reflection by applying a layer of photosensitive material to the surface, after which the layer is exposed to a regular pattern to light and developed to convert the regular light pattern into a regular array of protuberances (Clapham and Hutley, U.S. Pat. No. 4,013,465).

While investigators have thus appreciated the desirability of forming such surfaces for antireflective applications, it has not heretofore been known how to provide such surfaces having an acceptable degree of uniformity across an extended surface nor how to produce surfaces in a commercially acceptable manner.

Solar collectors utilizing porous coatings to increase the absorptivity and to minimize the radiation loss due to reverse reflected radiation (visible or IR) are also known. It is also known to utilize micropores, grooves or other "textural" effects in such devices to effect an increase in absorptance. (J. Vac. Sci. Tech., Vol. 12, No. 1, Jan/Feb (1975)). For example, U.S. Pat. No. 3,490,982 (Sauveniere et al) discloses a method of treating a glass surface to provide a microstructured surface exhibiting reduced reflectivity. Such coatings, surface treatments and the like have not proven commercially acceptable, possibly due to the instability of the surfaces, cost or inability to provide uniform surfaces over extended areas.

While not heretofore directed to the formation of articles having desirable optical properties, it is known to treat metal surfaces such as aluminum with water and to thereby form a porous oxide or hydroxide (boehmite) surface layer. See, for example, U.S. Pat. Nos. 3,871,881 and 3,957,197, which patents disclose prior inventions of one of the present inventors, V. Mikelsons.

SUMMARY OF THE INVENTION

The present invention is directed to an article exhibiting an appreciable reduction in specular reflectance and, if provided with a transparent substrate, improved transmissive characteristics over that available heretofore, which articles are exceptionally stable, low cost, can be provided over extended areas, and can have complex surface shapes.

The articles of the present invention comprise a substrate which may be of virtually any construction, i.e., transparent or opaque, insulator, semiconductor or metal, having a flat, curved or complex shape, and have formed thereon an oxide coating of a metal selected from the group consisting of aluminum, magnesium or zinc or alloys thereof. The oxide coating is formed by the substantially complete conversion of a thin-film of a metal or metal alloy, the thickness of which thin-film prior to conversion was at least five nanometers. In the present invention, it surprisingly has been found that articles having essentially the same antireflecting and transmitting characteristics may be formed from thin-films having thicknesses prior to conversion of as much as 200 nm, and from thin-films in which the thickness varies appreciably over the surface of the article. Thus, careful control of the thickness of the starting thin-film is not necessary. The articles of the present invention are characterized by a surface containing a plurality of randomly positioned discrete leaflets of varying heights and shapes, which leaflets extend from said substrate a distance of not less than twenty nm, nor more than the wavelength of light, and the bases of which are in substantial contact with the bases of each of adjacent leaflets. When so structured, the article preferably exhibits a total specular reflectance from the coated surface of less than one percent when normally incident radiation is varied over a range of wavelengths extending at least between 380–700 nm.

In one embodiment of the present invention, the article comprises a transparent substrate of glass or quartz or other inorganic transparent material or of polyimide, polyester, polystyrene, polymethylmethacrylate, polycarbonate, polypropylene or other polymeric material. When so constructed such that internal absorption of incident radiation may be appreciably ignored, the article preferably exhibits a total transmissivity of normal incident light of not less than 98% over the same range of wavelengths.

While such articles have broad general utility, the present invention is further directed to a variety of specific devices utilizing one or more such articles and the antireflecting/transmissive surfaces thereof. One general type of such devices may be categorized as passive devices, i.e., those in which the substrate or other components of the device do not actively interact with incident radiation, to convert it to other forms of energy. In one example thereof, a transparent substrate is shaped to provide an optical element such as a lens or prism, or particularly, a fresnel lens wherein the antireflecting coating is applied to at least one if not all of the radiation transmissive surfaces, such as on a grooved fresnel surface.

When utilized in "active" devices, i.e., those in which incident radiation is converted to enable the energy to be transported to another site, such as solar collectors, heat pipes, photovoltaic cells, etc., the substrate may be either transparent or opaque as appropriate for the given application. For example, a flat plate solar collector having exceptional characteristics, made according to the present invention, comprises the antireflecting coating and one or more radiation absorption surfaces. In an alternative device, the active construction may include heat pipes, radiators or other heat transfer components to which is directly applied the antireflecting coating, or which are used in conjunction with transparent substrates having the antireflecting coating. In a further active construction, the device may comprise a semiconductor substrate which is treated to have the antireflecting coating.

The articles of the present invention are made via a very simple and inexpensive process. In this process, a thinfilm of a metal (Al, Mg or Zn, or alloys thereof) is deposited onto a selected substrate. As mentioned hereinabove, the substrate may be virtually any material. If desired, primers or appropriate pretreatments may be applied to the selected substrate to improve the adherence or uniformity of the thin-film to the substrate. Typically, such metal films may be provided via conventional evaporation, sputtering or chemical vapor deposition methods; however, other methods may similarly be employed.

The deposited metal thin-film is then converted to an oxide or hydroxide coating by a chemical or chemical-/electrochemical method whereby the coating has a rough and structured topography possessing the requisite antireflecting and transmissive characteristics. For example, in the present invention, a uniform conversion is accomplished by exposing the thin-film to water for a duration and at a temperature sufficient to convert the thin-film to a substantially transparent oxide coating which, in a preferred embodiment, has a reflectivity less than 1%. If the coating is on a transparent substrate such that internal absorption can be ignored, the article preferably exhibits a transmissivity of not less than 98%.

In one preferred embodiment, the complete conversion of the metal thin-film is effected by applying a wetting agent to the thin-film and thereafter exposing the film to saturated steam for a duration ranging between 0.5 and 60 minutes, at a temperature ranging between 85° and 98° C. In an alternative preferred embodiment, the thin-film is immersed in an aqueous oxidizing solution at a temperature of not less than 25° C. for a duration of not less than 0.5 minutes to achieve the conversion.

DESCRIPTION OF THE PREFERRED EMBODIMENTS

Figure 1:
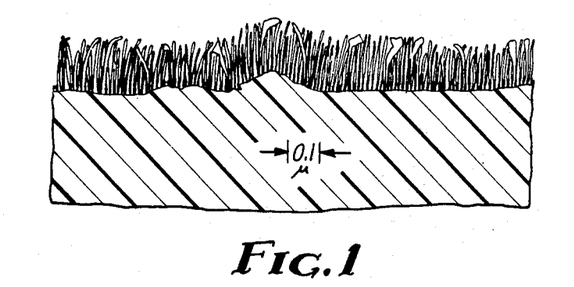
FIG. 1 is a reproduction of a transmission electron micrograph of a cross section of an article having an antireflecting coating thereon pursuant the present invention.

FIG. 1 is a reproduction of a transmission electron micrograph of a typical cross-section of an article of the present invention. As shown in FIG. 1, the articles exhibit a surface morphology which can generally be described as being a plurality of randomly positioned discrete leaflets of varying heights and shapes, the base of each leaflet being in substantial contact with the base of adjacent leaflets. The leaflets extend from a substrate a distance of not less than 20 nanometers, and preferably extend from the substrate a distance varying from that corresponding to the wavelength of light down to 1/10 that wavelength, such as approximately 100 to 150 nanometers. In such articles, the reflectivity is significantly reduced from similar but untreated articles, and if the articles comprise a transparent substrate, the transmissivity is appreciably increased. It is believed that these characteristics are due to a gradation in the index of refraction between that of the medium outside the surface of the article and that of the substrate of the article. A better understanding of the importance of such a leaflet structure and of its effect on the reflection and transmission of light can be obtained by analyzing the propagation of light incident on a boundary separating the media having differing indices of refraction. Equations describing such propagation are, for example, set forth in "Principles of Optics", M. Born and E. Wolf, Second Revised Edition, Pergamon Press, New York, New York (1964), pp. 23 ff. As is there described, the light reflected and transmitted at a boundary can be approximated by applying boundary conditions to the solutions of Maxwell's Equations. Even where the discontinuity is not mathematically sharp, so long as the change in the refractive index takes place over a distance which is very small (less than 1/10 the wavelength of light) compared with the wavelength of light used, such a theoretical treatment closely corresponds with experimental results. In the present invention, the change in the effective index of refraction varies over a distance ranging between the wavelength of light down to one-tenth that wavelength. Accordingly, it is believed that it is the property of a graded change in the refractive index over this distance which renders the article of the present invention antireflecting and, under certain conditions, more transmitting over an extended range of optical wavelengths.

According to a preferred process of the present invention, the article depicted in the micrograph represented in FIG. 1 may be formed according to the following steps:

(a) A thin-film of a metal, such as aluminum, is first deposited onto an appropriately selected substrate to a thickness which is desirably greater than 5 nanometers and which may range upwards to at least 200 nanometers (nm). Preferably, the film thickness is between 30 and 50 nm. While a uniform thickness film is desired, a nonuniform thickness film has been found to result in high quality optical properties. In one example, a thin-film, approximately 30 nm thick was vacuum evaporated onto a polyester (biaxially oriented polyethylene terephthalate) sheet. In alternative embodiments, thin-films of magnesium and zinc may also be deposited. Thin-films of other materials may also be deposited and chemically treated to produce similar microstructured coatings. The thin-films may be deposited by electroplating, sputtering, chemical vapor deposition, and other techniques. The substrate may be any material including other polymers such as polyimide, polystyrene, polymethylmethacrylate, polycarbonate, polypropylene, as well as inorganic materials such as glass, quartz, and semiconductors. The only limitation to such substrates appears to be that the material be stable under the conditions under which the metal film is deposited and subsequently converted. The substrate may also be of any shape, so long as the surface can be coated.

(b) The thus deposited metal thin-film is then converted to a coating or metal oxide or hydroxide by exposing the film to water for an appropriate duration and at a temperature until the metal layer becomes transparent and exhibits the requisite decrease in reflectivity. The conversion may be accomplished by exposing the metal thin-film to saturated steam or by immersing the film in aqueous oxidizing solutions. The required duration of treatment ranges from half a minute upward depending upon the thickness and type of metal thin-film used.

As will be more apparent from the specific examples set forth hereinafter, the articles of the present invention include optical elements such as lenses, prisms, beam splitters, couplers, and transmissive devices such as instrument windows, solar transmitting and absorption panels, etc. All such articles have the following advantages over prior art articles exhibiting antireflecting properties:

1. Through the use of a single layer, surfaces may be rendered antireflecting and more transmitting over a very wide range of wavelengths extending from the UV through the visible spectrum and up to at least 2.25 micrometers. I.e., the article of the present invention exhibits little or no dependence on the wavelength of incident light.

2. Furthermore, the reflectance from surfaces treated with such a single layer remain substantially the same as that for normal incident light over a very wide range of angles of incidence without an attendant increase in diffuse scattering, thereby making the articles highly desirable for use with curved optical surfaces, and for rendering flat surfaces non-reflecting even when viewed from wide angles such as with cover glasses for picture frames, etc.

3. The article of the present invention is significantly hydrophilic, and hence exhibits desirable nonfogging characteristics rendering it further useful in diverse optical applications.

4. The articles may be formed of a flexible substrate such that antireflecting screens and the like may be provided for "roll-up" applications, ease of storage, etc.

5. The article may further be used as a master to provide replicated articles having similar antireflecting characteristics.

6. The method of the present invention is extremely simple and inexpensive, requiring but two elementary operations and yet achieves a highly desirable optical article.

7. The method may be used with almost any type of substrate, having surfaces even containing complex geometries.

8. The method will produce antireflecting coatings which are stable, i.e., insoluble in water and useful even at appreciably elevated temperatures, and which adhere well to virtually any substrate.

9. The method has a wide process latitude and will produce desirable results over a wide range of thicknesses of the metal thin-film precursors as well as over a wide range of conversion techniques.

EXAMPLE 1

An article having the cross section shown in the reproduced micrograph of FIG. 1 was prepared as follows:

A 0.05 millimeter thick sheet of biaxially oriented polyethylene terephthalate (PET) was vapor coated with 33 nanometers (nm) of aluminum on one side and with 32 nm of aluminum on the opposite side. These aluminum films were then subjected to saturated steam at a temperature of approximately 95° C. for 3 to 4 minutes, during which time the films were completely converted to structured layers of boehmite (AlO(OH), approximately 120 nm thick. The resultant sheet was visibly more transparent than an uncoated control sheet of PET having the same thickness.

In order to determine the nature of the boehmite structure thus prepared, a section of the sheet was placed in a transparent epoxy potting compound, and, after curing, was cut into a thin section extending normal to the surface of the sheet. This thin section was then analyzed via transmission electron microscopy to produce an electron micrograph such as that reproduced in FIG. 1.

Figure 2:
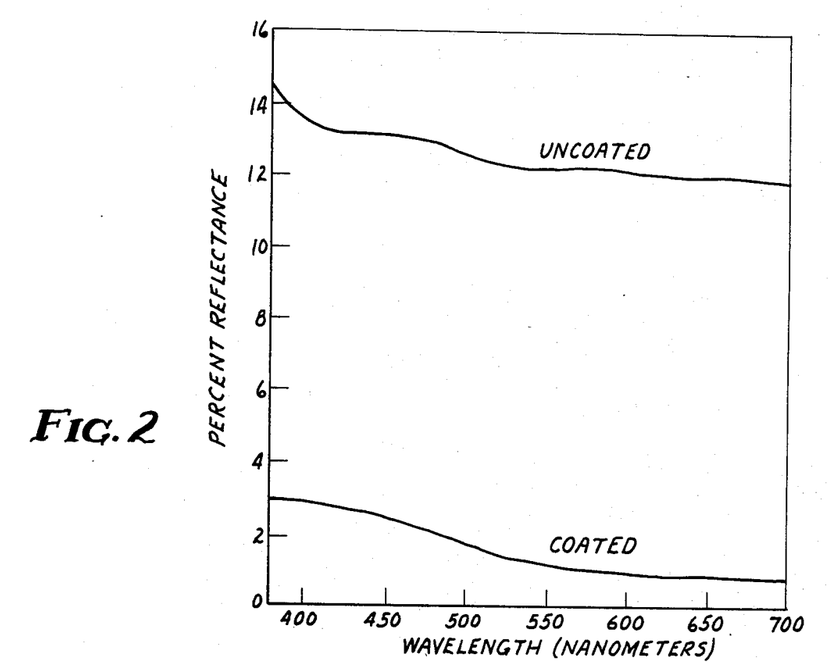
FIGS. 2 and 3 are spectra of the percent reflectance and transmission of a polyester sheet in an uncoated state and when coated on both sides with the antireflecting coating of the present invention.
Figure 3:
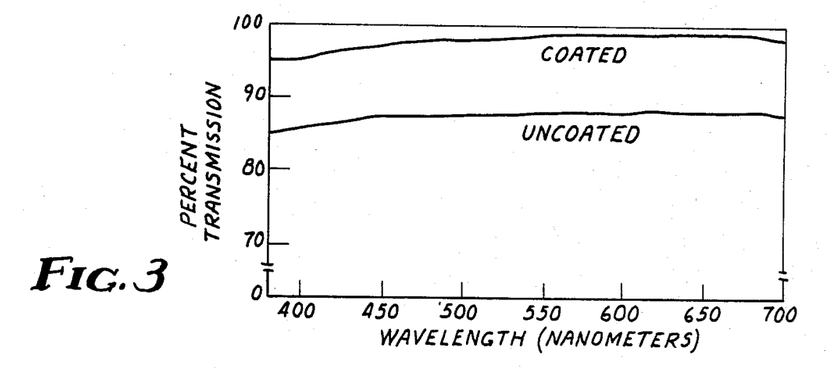

The spectacular reduction in reflectivity and similarly spectacular increase in light transmission for such an article are shown in FIGS. 2 and 3, respectively. It is there shown that the total reflectivity of a beam traversing the article so as to include the contribution from both sides of a thus coated sheet is approximately less than 2% over a range of wavelengths extending between 350 and 700 nm. The reflectivity from a single surface would be less than 1% over the same range of wavelengths. In comparison therewith, FIG. 2 also indicates that an uncoated sheet of PET would exhibit a reflectivity of approximately 12% for both surfaces or a reflectivity of approximately 6% for one such surface. As shown in FIG. 3, the PET sheet coated pursuant the present invention exhibits a light transmissivity in excess of approximately 95% over the same range of wavelengths, whereas the uncoated sheet of PET exhibited a transmissivity of not less than 85%. An increase in transmissivity of approximately 10% throughout the entire visible spectrum was thus achieved. A similar increase in transmission is present in the infrared region of electromagnetic radiation, i.e., extending out to approximately 2600 nm.

Figure 4:
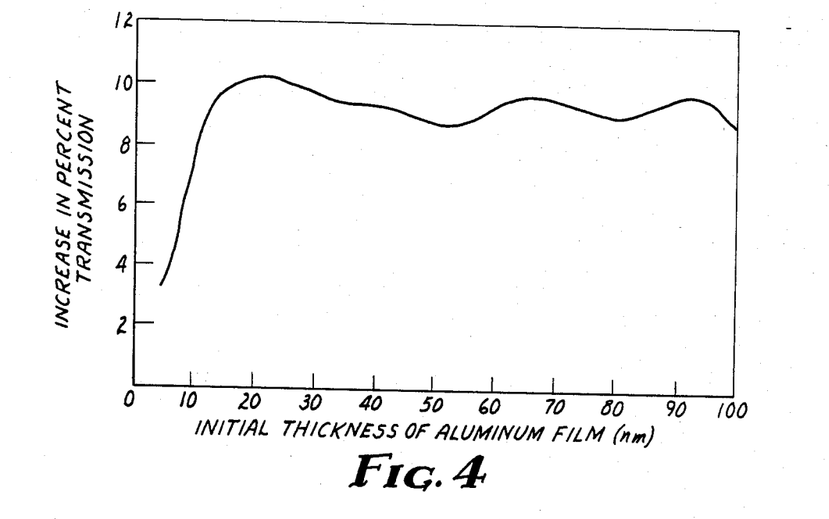
FIG. 4 is a plot of the increase in percent transmission as a function of the initial thickness of an Al thinfilm used to form an antireflecting coating pursuant the present invention.

As mentioned hereinabove, the transmissivity and reflectivity of the articles of the present invention are markedly independent of the thickness of the initial metal thin-film layer. In one set of tests, thin-films of aluminum on PET substrates having initial thicknesses ranging between 10 and 100 nm have been prepared and converted via steam treatment as discussed hereinabove. As shown in FIG. 4, the resultant increase in percent transmission was found to be approximately 9% over this entire range of thicknesses. Furthermore, where thicker aluminum thin-films such as 200 nm were prepared and were converted by immersion of the film-substrate combination in an aqueous solution held at 60° C. for approximately one and one half hours, after which the films were found to be transparentized and hence to be fully converted, a similar increase in the percent transmission was observed.

The articles of the present invention are characterized not only by the marked decrease in reflectivity and increase in transmissivity, but also by remarkable adhesion of the converted layer to the substrate. For example, where a typical Al film on polyester is completely converted to the boehmite structure, and a section of 3M Brand Magic Transparent Tape is applied to the boehmite coating and is then peeled back at an angle of 180°, the boehmite layer is not removed from the substrate. Rather, the adhesive is found to be stripped from the backing.

It has also been found that the converted oxide layer, such as that of boehmite, exhibits an appreciable hydrophilic nature, such that it is desirably used on optical elements and the like where an advantageous antifogging characteristic is provided.

Figure 5:
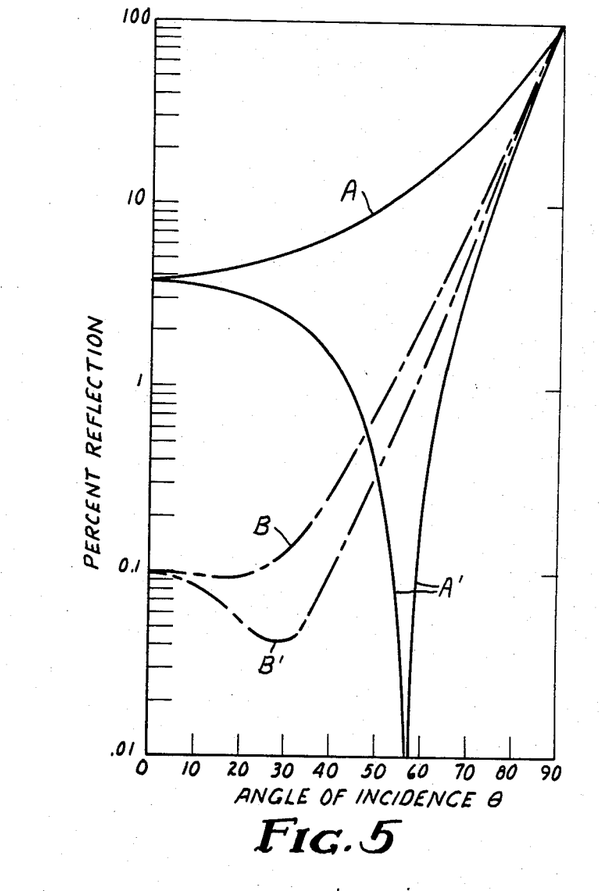
FIG. 5 is a plot of the reflectance as a function of the angle of incidence for an uncoated glass plate and a similar plate coated pursuant the present invention.

FIG. 5 provides a further indication of the independence of the reflectivity of the articles of the present invention as a function of the angle of incidence. In preparing the curves labeled A and B in that figure, a beam of light having a wavelength of 632.8 nm provided by a He-Ne laser polarized perpendicular (curves A and B) and parallel (curves A' and B') to the plane of incidence was impinged upon representative surfaces and the intensity of radiation specularly reflected was then determined. As shown in FIG. 5, when an uncoated glass surface was thus measured, the reflectivity of light polarized perpendicular to the plane of incidence was found to be approximately 4% from one surface when incident normal to the surface, and increased steadily to approximately 100% at an angle of incidence of 90° with respect to the normal (curve A). Correspondingly, the reflectivity of light polarized parallel to the plane of incidence was approximately 4% from one surface when incident normal to the surface, decreased gradually to approximately 0.01% at 57° with respect to the normal due to the Brewster effect and then gradually increased to 100% at 90° (curve A'). Where one surface of the glass plate was prepared with a single layer coating according to the present invention, the reflectivity at 0° with respect to the normal was approximately 0.1% for both perpendicular and parallel polarized light. The reflectivity measured with perpendicularly polarized light was found to gradually increase to approximately 100% at 90°, but remained at less than 1% up to approximately 55° (curve B). The reflectivity measured with parallel polarized light was found to exhibit a slight decrease up to approximately 30°, and again remained at less than 1% up to approximately 60° (curve B').

EXAMPLE 2

Figure 6:
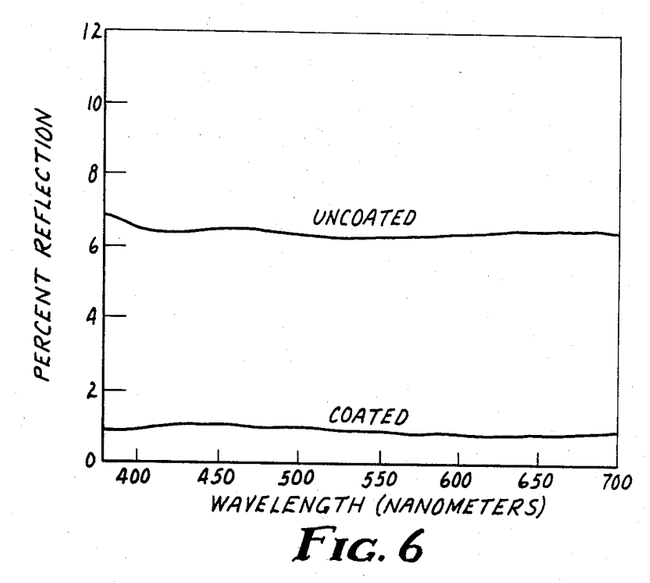
FIGS. 6 and 7 are spectra of the percent reflectance and transmission of a quartz glass sheet in an uncoated and coated state pursuant the present invention.
Figure 7:
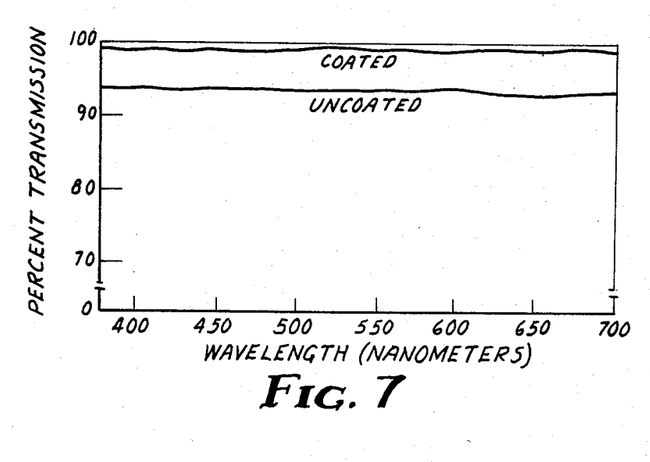

Desirable characteristics obtained with the present invention incorporating an inorganic substrate are indicated in an example in which a quartz plate was vapor coated in a conventional manner on both sides with 32.5 nm of aluminum. These aluminum films were pre-wet with an aqueous solution containing a wetting agent such as "Kodak Photo-Flo" and were then subjected to saturated steam for three to four minutes to form structured layers of boehmite approximately 120 nm thick. Results of the light reflectivity and transmissivity measurements made on this sample are shown in FIGS. 6 and 7, respectively. Again, as can be seen in these figures, a spectacular decrease in reflectivity and increase in transmissivity has been accomplished over the wavelength range from 400 to 700 nm. The reflectivity is less than 0.5 percent per surface. Due to the low absorptivity of quartz over extended wavelengths, the low reflectivity and high transmissivity was observed to be substantially unchanged from 350 nm through 2250 nm; hence, it is expected that similar properties extend further into the UV and IR ranges.

EXAMPLE 3

The utility of the present invention in producing antireflecting surfaces on optical elements having a complex geometry was demonstrated by coating a section of a fresnel lens formed of polymethylmethacrylate with approximately 39.5 nm of aluminum on the grooved or structured surface of the fresnel lens. Since such a material would warp unacceptably under the temperature (approximately 96° C.) typically used during the saturated steam treatment discussed in Examples 1 and 2 hereinabove, in this example the aluminum was converted to the boehmite coating by immersing the coated lens section in a 5% aqueous solution of $NaClO_2$ held at approximately 78° C. for approximately 5 minutes.

The antireflection properties of the grooved surface accomplished by the above process were very apparent to visual observation. The results of measurements of the total reflectivity and transmissivity were very similar to those shown in FIGS. 2 and 3 and 6 and 7 in that the properties were substantially independent of wavelength. In that the grooved surface of the fresnel lens produces appreciable scattering off normal incidence, the total reflectivity of an uncoated sample (both surfaces) is typically approximately 8%. In contrast, the reflectivity from a sample having the coating on the fresnel surface is typically approximately 6%. Accordingly, while the coating treatment of the present invention resulted in a reduction in the reflectivity in excess of 2%, this was not as marked a change as observed with planar samples.

EXAMPLE 4

In this example, a 0.05 mm thick sheet of polyethylene terephthalate was vapor coated in a conventional vacuum evaporation process with 27 nm of magnesium on one side of the polyester sheet. This thin-film was then completely converted to an oxide form by subjecting the film to saturated steam for three to four minutes at approximately 90° C. The reflectivity and transmissivity of the resultant converted coating again were found to be substantially like that shown in FIGS. 2 and 3 and 6 and 7 inasmuch as they exhibited virtually no dependence upon wavelength. In this example, the total reflectivity (both surfaces) of the sheet thus coated on one side only was found to have decreased from approximately 12% to approximately 8% while the transmissivity was found to have increased from approximately 85% to in excess of approximately 90%.

EXAMPLE 5

In a further modification of the process of the present invention, a 0.05 mm thick sheet of polyethylene terephthalate was vapor coated as in the above examples with 120 nm of aluminum. This evaporated thin-film was then electrolytically converted by electrically connecting the film to the positive terminal of a 7.0 volt potential source after which it was slowly immersed in an electrolyte consisting of 50% (by volume) $H_2SO_4$ in water. The negative electrode was provided by a lead plate immersed in the electrolyte solution. By so doing, the aluminum thin-film was substantially converted to aluminum oxide.

A small amount of residual aluminum remaining after the electrolytic process was subsequently converted by immersing the sample in a diluted solution of $NaClO_2$ in water at 80° C. for 10 minutes. After this treatment, the anodized area of the sample was found to be clear and to exhibit a significant reduction in the surface reflectivity and an appreciable increase in the transmissivity. Electron micrographs of this sample indicated that the resultant structured layer was coarser than those described in Example 1 hereinabove and as shown in FIG. 1.

EXAMPLE 6

Figure 8:
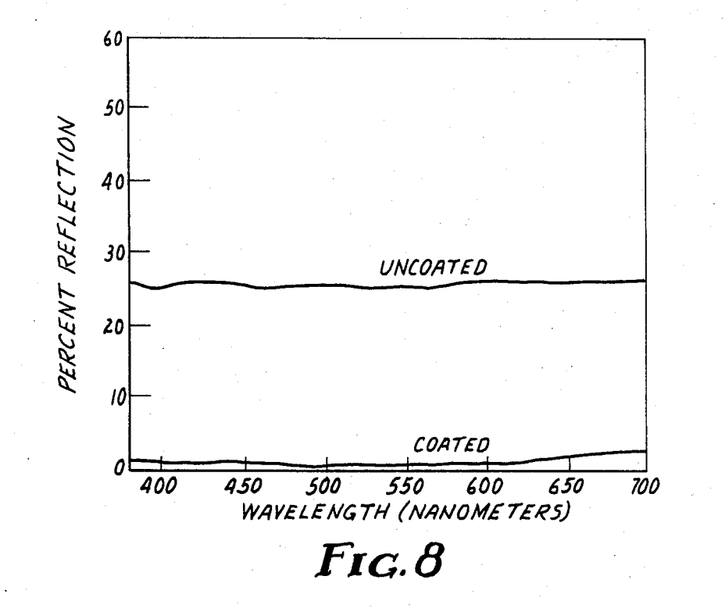
FIGS. 8 and 9 are spectra of the percent reflectance and transmission of four parallel spaced sheets of polymethylmethacrylate in an uncoated and coated state pursuant the present invention.
Figure 9:
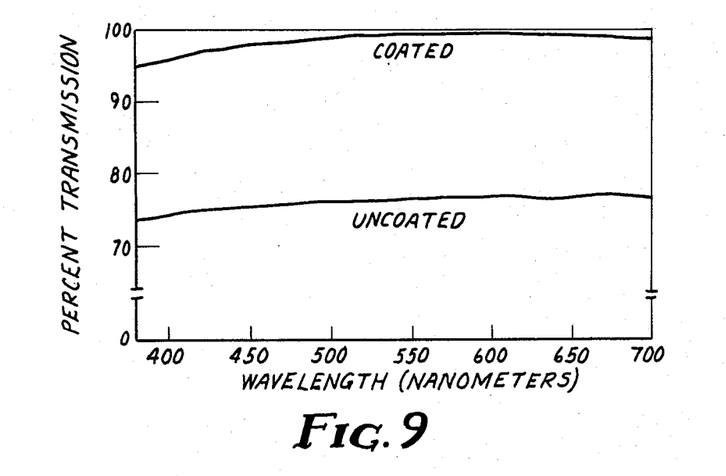

In a solar energy transmitting panel in which articles of the present invention were assembled to provide a multilayer assembly, four sheets of 1.6 mm thick polymethylmethacrylate were cleaned and where then vapor coated with 32 nm of aluminum on both sides of each sheet. These aluminum thin-films were then converted to the structured boehmite layers by the saturated steam process described in Example 1 hereinabove. The results in the reduction in the reflectivity and the increase in transmissivity for a stack of these four sheets (8 surfaces) when assembled with approximately one-half inch gap between each of the sheets are shown in FIGS. 8 and 9 respectively. In FIG. 8, it may thus be seen that whereas the assemblage of four such methylmethacrylate sheets in the uncoated form exhibited a reflectivity of approximately 25%, in the coated form the reflectivity was less than one percent. Similarly, whereas the transmissivity of an uncoated assemblage of such sheets was approximately 75%, the transmissivity of the assembled coated sheets was approximately 98%.

EXAMPLE 7

To demonstrate the utility of the present invention wherein a thin-film of zinc was employed as a precursor, a layer of silver less than 1 atomic layer thick was initially deposited on a polyethylene terephthalate sheet to facilitate the subsequent deposition of the thin-film of zinc. Such a zinc film was then vapor coated onto the silver nucleated surface via conventional vapor deposition processes to a thickness of approximately 45 nm. The zinc thin-film was then converted by exposure to steam at a temperature of approximately 96° C. for 30 minutes, after which the film was completely converted and substantially transparentized. It was subsequently found that the reflectivity of the coated sample was approximately 3 percent per surface across the visible range, in contrast to a reflectivity for the uncoated sample of approximately 6.7% per surface.

EXAMPLE 8

The suitability of the present invention in providing antireflecting coatings on a substrate of a polyimide sheet was demonstrated in a test in which a 45 nm film of aluminum was vapor coated onto a polyimide sheet, after which the aluminum film was converted to a boehmite structure by immersion of the coated sheet in deionized water at 60° C. for 20 minutes. The aluminum film was then substantially completely converted and was found to exhibit a total transmissivity at 700 nm of approximately 90%, whereas the untreated sheet had a transmissivity of approximately 86% at that wavelength. Corresponding increases in transmissivity were also found over a range of wavelengths extending from approximately 350 nm to 2200 nm.

EXAMPLE 9

The applicability of the present invention to provide antireflecting surfaces on a substrate of cellulose acetate butyrate is demonstrated in a sample in which a thin sheet of such a substrate was provided with a 45 nm film of aluminum via conventional vapor coating processes. This coating was then converted to a boehmite layer by immersion in deionized water at 60° C. for 20 minutes. Upon thus treating one side of the CAB substrate, the transmissivity was found to have increased throughout the visible region from approximately 91% for the untreated substrate to approximately 95% for the treated substrate.

EXAMPLE 10

The utility of the present invention utilizing a polycarbonate substrate was further found wherein such a substrate was provided with a 45 nm thick film of aluminum via conventional vapor coating processes. This thin-film was then converted to a boehmite layer by first wetting the film with an aqueous solution of "Photo-Flo" followed by exposure to steam at 96° C. for approximately 2 minutes. The transmissivity of such a sheet having the coating on one surface was found to have increased from approximately 80% for the untreated sheet to approximately 85% at a wavelength of approximately 500 nm. A similar increase in the transmissivity was observed from approximately 420 nm, at which this polycarbonate sample was significantly absorptive, through a wavelength of approximately 1,000 nm.

EXAMPLE 11

The utility of the present invention in providing an antireflecting surface on a polystyrene substrate was demonstrated in an example in which one surface of such a substrate was provided with a 45 nm film of aluminum via conventional vapor deposition. This film was then converted to a boehmite structure via immersion in deionized $H_2O$ for 20 minutes at 60° C. The untreated sheet of polystyrene was observed to have a transmissivity of approximately 85% at a wavelength of 500 nm. The transmissivity of the converted coating/substrate was approximately 90% at a wavelength of 500 nm, in contrast to that of 85% for an untreated substrate. A similar increase in the transmissivity was observed over a range of wavelengths extending from approximately 400 to at least 1,000 nm.

EXAMPLE 12

In a further embodiment of the present invention, a fresnel lens package including a glass cover plate, three linear fresnel lenses formed of DR61 acrylate copolymer obtained from K-S-H Inc., St. Louis, Missouri, and a fourth linear fresnel lens formed of type 147 F polymethylmethacrylate obtained from Rohm & Haas Company, were provided with antireflecting coatings on all interior surfaces as follows: The five elements were first coated with a 45 nm aluminum film via conventional vapor deposition. The glass cover plate and the acrylate 147 F fresnel lens were immersed for five minutes at 80° C. in a solution of 1% $NaNO_2$ in deionized water, one drop of a wetting agent such as "Triton X-100" per liter and a buffer such as 1% sodium acetate/acetic acid. The pH of the solution was adjusted to 6.65 with acetic acid. Following the conversion to the boehmite microstructure, these elements were then rinsed by dipping in deionized water at 80° C. and were air dried. The DR61 acrylic lenses were converted via immersion for six minutes at 70° C. in deionized water in which the pH was adjusted to 8.65 with sodium hydroxide. Following the conversion of the coating to boehmite, these elements were allowed to cool slowly in a humid environment for two to three minutes and were then dried in a stream of dry nitrogen. The thus coated lens elements were then assembled and were tested in an overhead projector in which the intensity of light transmitted through the lens assembly was measured both at the center and corner portions. A 20% increase in the light intensity over the entire microstructured area was observed compared to the intensity for a similar but uncoated lens assembly. Furthermore, a significant reduction in glare was achieved, and interference patterns previously observed due to slightly contacting elements eliminated.

In all of the examples set forth hereinabove, the substrate surfaces are desirably cleaned prior to the deposition of the metal thin-films to improve the adherence and uniformity of the metal deposition. It has further been found that surface contamination deleterious affects the uniformity of the resultant converted coatings and hence decreases the optical performances. The particular cleaning procedures are desirably modified depending upon the substrate selected.

EXAMPLE 13

In a further embodiment illustrative of the applicability of the present invention to large area surfaces such as architectural windows, a 1828 m roll of 130 cm wide polyethylene terephthalate sheet 0.05 mm thick was vapor coated on each side with about 35 nm of aluminum using conventional vapor deposition processes. 60 cm wide sections of this roll were then converted via exposing the sections to saturated steam as described hereinabove. These converted sections were measured for the percent transmission of the solar energy spectrum from 0.3 microns out to 2.2 microns. The film was found to be transmissive of 96.8% of the incident solar energy, compared to approximately 85% for good quality window glass.

EXAMPLE 14

The articles of the present invention are further useful in forming a master having a corresponding microstructured surface which may then be used to replicate articles having corresponding microstructured, antireflective surfaces. In such an embodiment, a 0.05 mm sheet of PET was coated with a 30 nm thin-film of Mg, which film was then converted to a structured surface by prewetting the surface with an aqueous solution of "Photo-Flo", followed by exposing the wet surface to saturated steam at approximately 90° C. for 20 seconds. The film was then completely transparentized, and was then washed in isopropyl alcohol and dried. The sturctured surface was then placed in contact with a 0.025 mm sheet of cellulose acetate butyrate (CAB), was placed in a press and was pressed at a temperature of 120° for 60 seconds. The sheets were then removed and separated. Optical measurements of the CAB surface indicated a correspondingly low reflectivity and high transmissivity.

Alternatively, as disclosed in the copending application by Messrs. Maffitt et al referred to hereinabove, a master may be prepared from a boehmite coating on glass prepared as discussed hereinabove, which coating is successively overcoated with a 80 nm film of Cr, 40 nm film of Ni and a 80 nm of Cu. The conductive outer Cu film was then used as an electrode and a 500 micrometers thick layer of Ni electroplated thereon. The glass substrate was then stripped away and residual boehmite bound to the now exposed Cr surface etched away. This resultant stamper was then used to thermally emboss large quantities of polymeric articles with a structured surface having similar antireflecting characteristics.

Such replicated articles are desirable improvements over articles having the microstructured surfaces coated directly thereon, in that the coated surfaces are relatively sensitive to abrasion, scratching and the like. Such coatings are thus primarily suitable for use in applications where the coatings are protected, such as on interior surfaces of lenses, windows, and the like. In contrast, the replicated surfaces are more durable and less brittle and may be used in more exposed locations.

EXAMPLE 15

In another embodiment, the utility of the present invention was demonstrated on an opaque substrate. A steel plate was coated with glossy black paint and the painted layer was subsequently provided with a film of aluminum 50 nm thick. This film was then converted to boehmite via exposing to steam at a temperature of 96° C. for three minutes. Subsequent to conversion, the reflectivity of the glossy paint layer and that of the resultant boehmite layer were compared with that obtained from a black velvet cloth. The glossy black paint was found to exhibit a reflectivity at normal incidence of 4.7% at 500 nm. In contrast, the black velvet cloth exhibited a reflectivity at the same wavelength of approximately 0.2%. The converted boehmite layer on top of the glossy black paint exhibited a reflectivity just slightly in excess of that for the black velvet, i.e., approximately 0.25%. The reflectivity over a range of wavelengths extending from 350 to 700 nm was substantially the same, hence it is expected that a similar reflectivity will extend into the UV and IR ranges, dependent somewhat on the reflectivity characteristics of the paint layer.

EXAMPLE 16

In a further test to determine the stability of the converted coating, thin-films of 35 nm of aluminum were coated on one side of a number of glass plates and were subsequently converted to boehmite by exposure to steam at 96° C. for two minutes. The reflectivity of the untreated glass plates at 500 nm was determined to be approximately 8% for both surfaces. In contrast, the reflectivities of the coated slides were found to be approximately 4.8% for both surfaces. These plates were then subjected to prolonged exposure at various elevated temperatures as follows: One plate was exposed at 210° C. for 93 hours after which the reflectivity had increased to approximately 4.85% for both surfaces. Another plate was heated at 460° C. for 66 hours, after which the reflectivity was determined to be approximately 4.5% for both surfaces. Another plate was treated at 560° C. for 22½ hours, after which the reflectivity was determined to be approximately 4.4% for both surfaces. These above examples thus demonstrate the exceptional stability of the coatings of the present invention even at elevated temperatures, which properties are of significant importance in solar applications.

Having thus described the present invention, what is claimed is:

1. An article having a substantially antireflecting surface such that the specular reflection of visible light directed thereat is appreciably reduced, said article comprising a substrate having a surface coating of an oxide of a metal selected from the group consisting of aluminum, magnesium and zinc or alloys thereof, which coating is a substantially complete conversion of a thin-film of said metal, the thickness of said thin-film prior to conversion being at least 5 nanometers and exhibiting a surface after said conversion characterized by a plurality of randomly positioned discrete leaflets of varying heights and shapes, which leaflets extend from said surface a distance of not less than 20 nanometers nor more than the wavelength of light, and the bases of which contact the bases of substantially all adjacent leaflets.

2. An article according to claim 1, further characterized by a total reflectance from the coating of visible light incident normal to the surface of less than one percent.

3. An article according to claim 1 wherein said substrate is a transparent material comprising polyimide, polystyrene, polyester, polymethylmethacrylate, polycarbonate, polypropylene, quartz or glass through which the total transmissivity of said normal incident light is greater than that of the material without the coating.

4. An article according to claim 1, wherein said substrate is an insulating or semiconductor inorganic material.

5. An article according to claim 4, wherein said semiconductor material is selected from a material, such as silicon having desirable photovoltaic properties such that when provided in a photovoltaic cell, the antireflecting coating effects an increase in the transmission of radiant energy into the cell and thereby increases the effective efficiency of the cell.

6. An article according to claim 1, wherein said substrate is opaque and wherein the coating thereon decreases the reflectance of radiation therefrom such that the absorption of radiation by the substrate is maximized.

7. An article according to claim 1, wherein said substrate is selected of a transparent material and is shaped to form an optical element, and wherein the coating thereby decreases the reflectance from a surface of the element and improves the transmissivity thereof over a similar but uncoated element.

8. An article according to claim 7, wherein the optical element is grooved Fresnel-type lens having the coating on at least the grooved surface.

9. An article according to claim 8, wherein the optical element comprises a plurality of Fresnel-type lenses and at least one planar cover plate, wherein at least some of the lenses and the cover plate are spaced apart to provide a compound lens assembly, and wherein all interior surfaces of the lenses and the cover plate are provided with said coating.

10. An article according to claim 1, wherein said substrate is an insulating, solar energy transmitting panel and wherein the surface coating provides antireflecting characteristics to prevent reflection of appreciable amounts of incoming radiant energy, thereby adapting the panel for use in passive solar heating systems.

11. An article according to claim 10, wherein said article is further characterized by a total transmissivity of said normal incident light of not less than 98%.

12. An article according to claim 10, wherein said panel further comprises outer panels of at least an optically translucent, if not transparent, nature and at least one said substrate having a said coating thereon sandwiched between the panels.

13. In an article comprising a transparent flexible substrate having thereon a coating of boehmite, the improvement wherein the coating is characterized by a plurality of closely spaced and randomly positioned discrete leaflets of varying heights and shapes, which leaflets extend from the substrate a distance of not less than 20 nm nor more than the wavelength of visible light, and the bases of which contact the bases of substantially all adjacent leaflets to provide the article with a total specular reflectance of visible light incident normal to the surface coating of less than one percent, and a transmissivity of said normal incident light of not less than 98%, and wherein the surface coating is substantially hydrophilic, whereby the particles may be useful as optical lenses, solar absorbers, photovoltaic cells and the like such that the reflectance is decreased and transmissivity is enhanced over similar but uncoated articles to enable greater amounts of light and/or radiant energy to be passed therethrough.

14. A grooved Fresnel-type lens comprising a polymeric body having on at least one surface thereof an array of grooves forming a Fresnel-type lens and having on at least the grooved surface a coating of an oxide or hydroxide of a metal selected from the group consisting of aluminum, magnesium and zinc or alloys thereof, which coating is a substantially complete conversion of a thin-film of said metal, the thickness of said thin-film prior to conversion being at least 5 nanometers and exhibiting a surface after said conversion characterized by a plurality of randomly positioned discrete leaflets of varying heights and shapes, which leaflets extend from the surface a distance of not less than 20 nanometers nor more than the wavelength of light, and the bases of which contact the bases of substantially all adjacent leaflets to appreciably reduce the specular reflection of visible light directed toward said coating.

* * * * *